(12) United States Patent
Lasich

(10) Patent No.: US 9,525,089 B2
(45) Date of Patent: Dec. 20, 2016

(54) RECEIVER

(75) Inventor: John Beavis Lasich, Balwyn (AU)

(73) Assignee: Raygen Resources Pty Ltd., Malvern, Victoria (AU)

( * ) Notice: Subject to any disclaimer, the term of this patent is extended or adjusted under 35 U.S.C. 154(b) by 0 days.

(21) Appl. No.: 13/876,623

(22) PCT Filed: Sep. 28, 2011

(86) PCT No.: PCT/AU2011/001245
§ 371 (c)(1),
(2), (4) Date: Mar. 28, 2013

(87) PCT Pub. No.: WO2012/040779
PCT Pub. Date: Apr. 5, 2012

(65) Prior Publication Data
US 2013/0180569 A1    Jul. 18, 2013

(30) Foreign Application Priority Data
Sep. 28, 2010 (AU) ............................... 2010904354

(51) Int. Cl.
| H02S 30/10 | (2014.01) |
| H01L 31/04 | (2014.01) |
| H01L 31/042 | (2014.01) |
| H01L 31/052 | (2014.01) |

(52) U.S. Cl.
CPC ....... *H01L 31/0424* (2013.01); *H01L 31/0521* (2013.01); *H02S 30/10* (2014.12); *Y02E 10/50* (2013.01)

(58) Field of Classification Search
CPC ...... H01L 31/042; H01L 31/05; H01L 31/052; H01L 31/0521

USPC ........ 136/205, 206, 218, 244, 246, 252, 259
See application file for complete search history.

(56) References Cited

U.S. PATENT DOCUMENTS

| 4,187,123 A | 2/1980 | Diggs | |
| 2002/0074458 A1* | 6/2002 | Laraway et al. | 244/173 |
| 2006/0283497 A1 | 12/2006 | Hines | |
| 2008/0087321 A1 | 4/2008 | Schwartzman | |
| 2010/0065044 A1* | 3/2010 | Reader et al. | 126/676 |
| 2010/0089434 A1 | 4/2010 | Fishman | |
| 2010/0294266 A1* | 11/2010 | Fung | 126/688 |
| 2012/0037206 A1* | 2/2012 | Norman et al. | 136/246 |
| 2012/0133322 A1* | 5/2012 | Walsh et al. | 320/101 |

FOREIGN PATENT DOCUMENTS

JP       2003134667 A  *  5/2003

OTHER PUBLICATIONS

JP2003134667a, May 2003, Otake et al. English equivalent of the abstract.*

(Continued)

*Primary Examiner* — Susan D Leong
(74) *Attorney, Agent, or Firm* — Morrison & Foerster LLP

(57) ABSTRACT

A receiver for a solar radiation-based electrical power generation system comprises a plurality of photovoltaic cells, with the cells being arranged in modules, with each module comprising one or more than one cell, and with the modules being arranged in subarrays, with each subarray comprising a plurality of modules. The receiver also comprises a support framework for the subarrays.

15 Claims, 7 Drawing Sheets

(56) References Cited

OTHER PUBLICATIONS

Authorized officer Jayati Ray, International Search Report in PCT/AU2011/001245, mailed Nov. 11, 2011, 3 pages.
Swanson, R. M. "Photovoltaic Central Receiver Systems," The 1992 ASME, JSES, KSES International Solar Energy Conference, Apr. 5-9, 1992, Maui, Hawaii; pp. 1067-1070.

* cited by examiner

RECEIVER

The present invention relates to a receiver for a solar radiation-based electrical power generation system.

Solar radiation-based electrical power generating systems typically include:

(a) a receiver that includes an array of photovoltaic cells for converting solar energy into electrical energy, (b) an electrical circuit for transferring an electrical energy output of the photovoltaic cells to an end-use application for the electrical energy; and (c) a concentrator for concentrating solar radiation onto the photovoltaic cells of the receiver.

The present invention is applicable particularly, although by no means exclusively, to large scale solar radiation-based electrical power generating systems of the type described above that are capable of producing substantial amounts of electrical power ready for conditioning to at least 20 kW of standard 3 phase 415 volt AC power.

End-use applications for such large scale power generating systems include remote area power supply for isolated grids, mains grid-connected power, water pumping, telecommunications, crude oil pumping, water purification, and hydrogen generation.

A paper entitled "Photovoltaic Central Receiver Systems" (1992) by R Swanston discloses a general concept of a dense array receiver. The general concept involves mounting a large number of closely-packed concentrator photovoltaic cells to generate large quantities of electrical power.

There are a number of technical issues associated with the development of commercially viable solar radiation-based electrical power generating systems of the type described above which include dense array receivers. These issues include minimizing dead space (i.e. surface area that is exposed to solar radiation and is not covered by photovoltaic cells and hence does not generate electricity), solar radiation flux variations, component serviceability and replacement, system scale-up, and component and sub-system monitoring.

The present invention provides a receiver for a solar radiation-based electrical power generating system that addresses at least some of these issues.

The above description is not to be taken as an admission of the common general knowledge in Australia and elsewhere.

According to the present invention there is provided a receiver for a solar radiation-based electrical power generation system that comprises:

(a) a plurality of photovoltaic cells, with the cells being arranged in modules, with each module comprising one or more than one cell, and with the modules being arranged in subarrays of the receiver, with each subarray comprising a plurality of modules and being a separate unit to the other subarrays, and (b) a support framework for the subarrays.

The term "separate unit" as used herein is understood to mean that each subarray is a structurally separate unit to the other subarrays and is not directly connected to the other subarrays.

In some situations of particular interest to the applicant, the term "separate unit" as used herein is also understood to mean that each subarray can be (a) operated and maintained independently of the other subarrays or (b) operated and maintained in parallel with the other subarrays.

The receiver may comprise a management system, such as an optical management system, for avoiding shading (i.e. under-illumination) or excessive illumination of any particular cells in the receiver or otherwise managing the exposure of photovoltaic cells to solar radiation.

The receiver may comprise a monitoring system, such as an optical monitoring system, for monitoring the condition of any components in the receiver.

Each module may comprise an electrical power collection system for collecting power from the photovoltaic cells.

More particularly, each subarray may comprise an electrical power collection system for collecting power from the modules.

In addition, the receiver may comprise an electrical power collection system for collecting power from the subarrays.

Each subarray electrical power collection system may be separately connectable to the receiver electrical power collection system.

Each subarray may comprise a monitoring system for collecting condition data from the modules.

The receiver may comprise a monitoring system for collecting condition data from the subarrays.

The support framework may be positioned at least substantially behind a shadow of the photovoltaic cells of the receiver. Hence, adjacent subarrays may be close-packed with little or no dead space between them.

The photovoltaic cells, the modules and the subarrays may be any suitable size and construction.

In terms of size, by way of example, the cells may be 100 mm×100 mm, there may be up to 100 cells or more cells in a module, and there may be up to 100 modules or more modules in a subarray. With this arrangement there are 100 modules per square meter. Each subarray may weigh of the order of 100 kg.

Each module may comprise a close-packed array of photovoltaic cells. In this context, the term "close-packed" is understood to mean that the effective surface area of the photovoltaic cells that is directly exposed to solar radiation is at least 95%, typically at least 97%, of the total exposed surface area of the module.

Each module may comprise a single photovoltaic cell.

Each subarray may comprise a close-packed array of modules. In this context, the term "close-packed" is understood to mean that the effective surface area of the modules that is directly exposed to solar radiation is at least 95%, typically at least 97%, of the total exposed surface area of the subarray.

The receiver may comprise a close-packed array of subarrays. In this context, the term "close-packed" is understood to mean that the effective surface area of the subarrays that is directly exposed to solar radiation is at least 95%, typically at least 97%, of the total exposed surface area of the receiver.

The receiver may include a suitably-shaped reflective spacer or other element to re-direct solar radiation that would otherwise contact surface area of the receiver that is dead space, i.e. surface area that is exposed to solar radiation and is not covered by photovoltaic cells.

Each subarray may be positioned as a separate, independently movable unit in the support framework.

The receiver may comprise a coolant system for supplying coolant to and discharging coolant from each subarray separately to the other subarrays. One advantage of this arrangement is that it is not necessary to drain coolant from the whole receiver when carrying out replacement of an individual subarray.

Each subarray may comprise a coolant system for supplying coolant from the receiver coolant system to the subarray modules and supplying heated coolant from the subarray modules to the receiver coolant system.

The coolant system for each subarray may include separate inlets for supplying coolant to each module in the subarray, and separate outlets for removing heated coolant from each module. Hence, there may be separate and independent coolant flow to each module in the subarray.

The receiver coolant system may be operable to provide separate coolant flow to each subarray and each subarray coolant system may be operable to provide separate coolant flow to each module in the subarray. With this arrangement the receiver is operable as a parallel coolant flow system.

The receiver coolant system and each subarray coolant system may be coupled together, for example via flexible hosing or other suitable means, so that it is not necessary to disconnect the subarray coolant system from the receiver coolant system when moving a subarray between the operative position and the maintenance position of the subarray. One advantage of this arrangement is that it is not necessary to drain coolant from the whole receiver when carrying out maintenance of an individual subarray.

The coolant system for each subarray may be a self-sealing system, for example via self-sealing valves, to close the system for an individual module when the module has to be removed from the subarray without affecting the coolant system for other modules. As a consequence, replacement of modules does not necessitate draining of the entire coolant supply and discharge system. This avoids wastage of coolant and avoids the need to de-aerate the plumbing (typically a 0.5-1 day time saving).

The coolant system for each subarray may be a quick release system so that modules can be quickly and conveniently engaged with and released from the coolant system.

The receiver may comprise an electrical power collection system for collecting electrical power from each subarray separately from the other subarrays.

Each subarray may comprise an electrical power collection system for collecting electrical power from each module.

Each subarray may comprise an electrical power collection system for collecting electrical power from each module separately to the other modules in the subarray.

The subarray electrical power collection system may comprise a plurality of busbars arranged so that connection elements such as connection pins of each module in the subarray engage the busbars of that subarray directly.

Each subarray electrical power collection system may be connected electrically via a flexible cable or other suitable means that connects in parallel or series to a the receiver electrical power collection system.

The receiver electrical power collection system may be operable to collect electrical power separately from each subarray and each subarray electrical power collection system may be operable to collect electrical power separately from each module in the subarray. In this arrangement the receiver is a parallel electrical power collection system. This receiver architecture is advantageous in terms of minimising the susceptibility of the receiver to flux variations across the subarrays and the receiver.

The receiver may be arranged so that the above-described parallel electrical power collection system includes at least 50% of the modules.

The support framework may provide structural support for the subarrays and a support for any one or more than one of the receiver management system, the receiver monitoring system, the receiver coolant system, and the receiver electrical power collection system.

The support framework may support the subarrays so that each subarray can be separately replaced in the receiver.

The support framework may support the subarrays so that each subarray can be separately moved from an operational, i.e. on-Sun, position to a maintenance, i.e. off-Sun, position displaced rearwardly of the operational position so that maintenance work can be carried out on the subarray and components of the subarray in a convenient and safe manner without removing the subarray altogether from the receiver. With this arrangement, when the maintenance work is completed, which may include replacement or some of the components of the subarray, the subarray can be moved from the maintenance position to the operational position.

For example, the support framework may support the subarrays so that each subarray can be separately replaced in the receiver by moving the subarray rearwardly from the operational position to the maintenance position of the photovoltaic cells to allow access to the subarray to allow the subarray to be disengaged from the receiver coolant system and the receiver electrical power collection system altogether and replaced with another subarray.

The support framework may comprise a series of rollers or runners or other guide elements that support the subarrays and facilitate rearward and forward sliding or similar movement of each subarray from the operational position to the maintenance position and vice versa.

The present invention also provides a solar radiation-based electrical power generating system that includes the above-described receiver.

The present invention is described further with reference to the accompanying drawings which illustrate one embodiment of a receiver in accordance with the present invention, of which:

FIG. 1 is front view of a part of one embodiment of a receiver in accordance with the present invention which comprises 4 subarrays, with each subarray comprising 100 modules, and each module comprising 100 photovoltaic cells;

Figure 1:
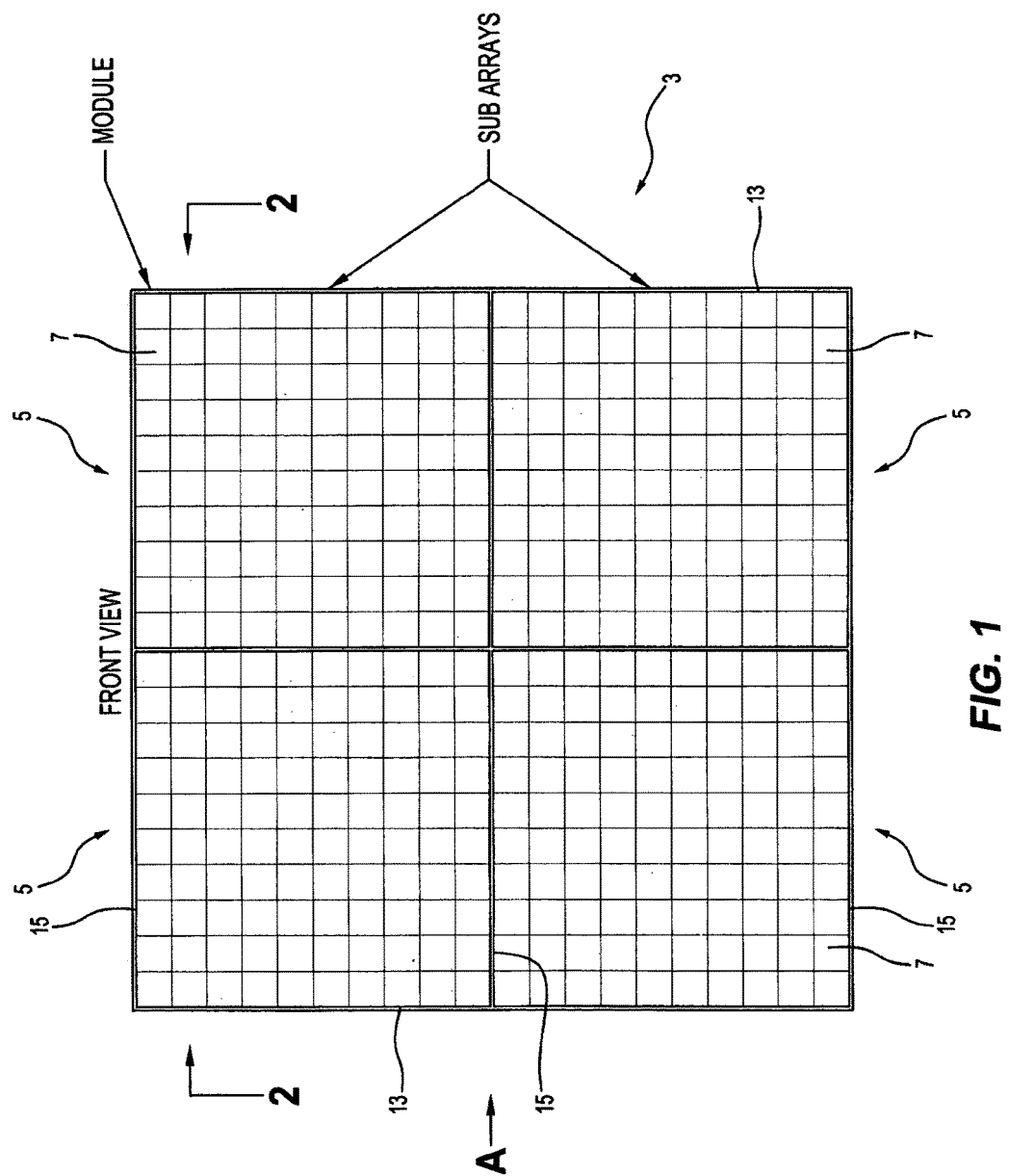
Figure 2:
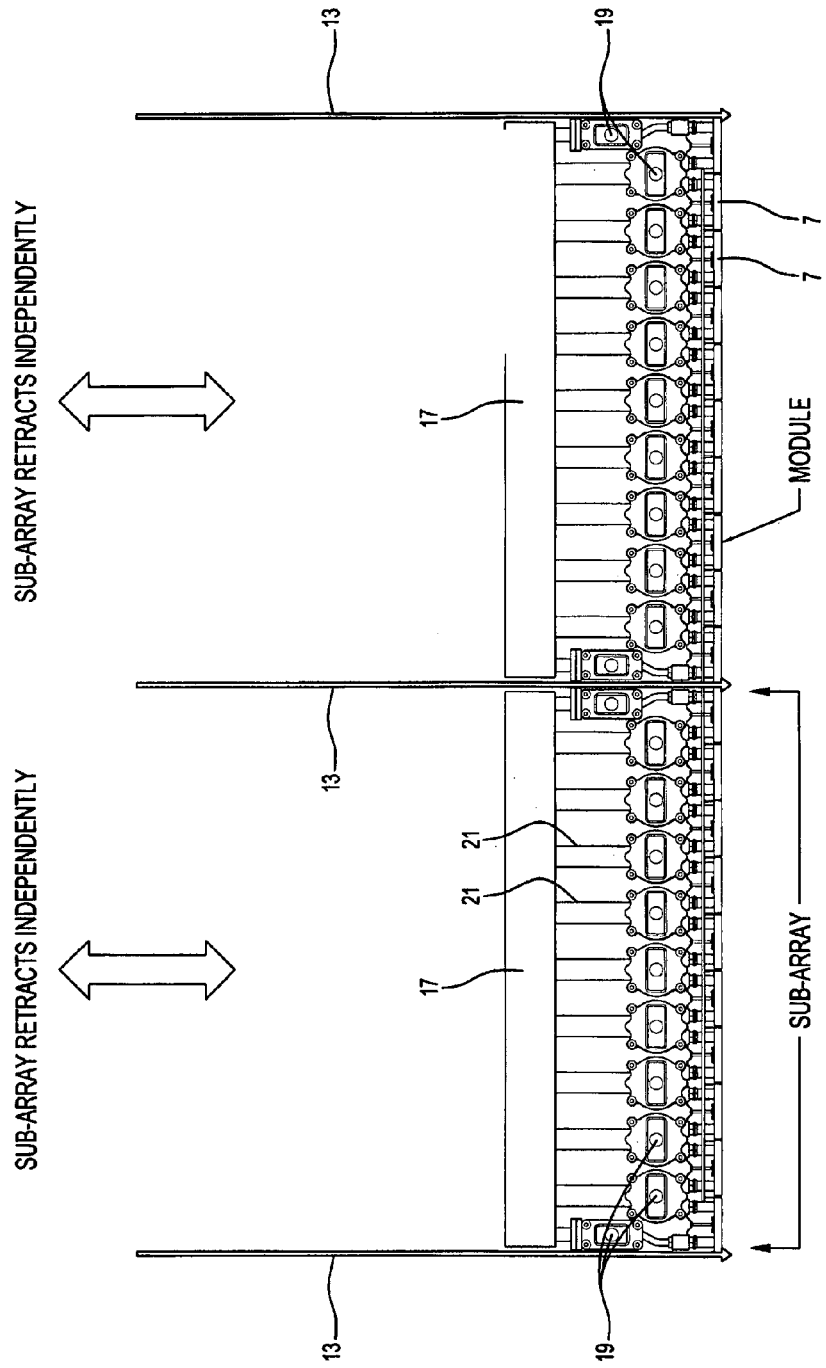
FIG. 2 is a cross-section along the line 2-2 in FIG. 1 which focuses on the construction of the subarrays and does not include other components of the receiver in order to simplify the drawing.
Figure 3:
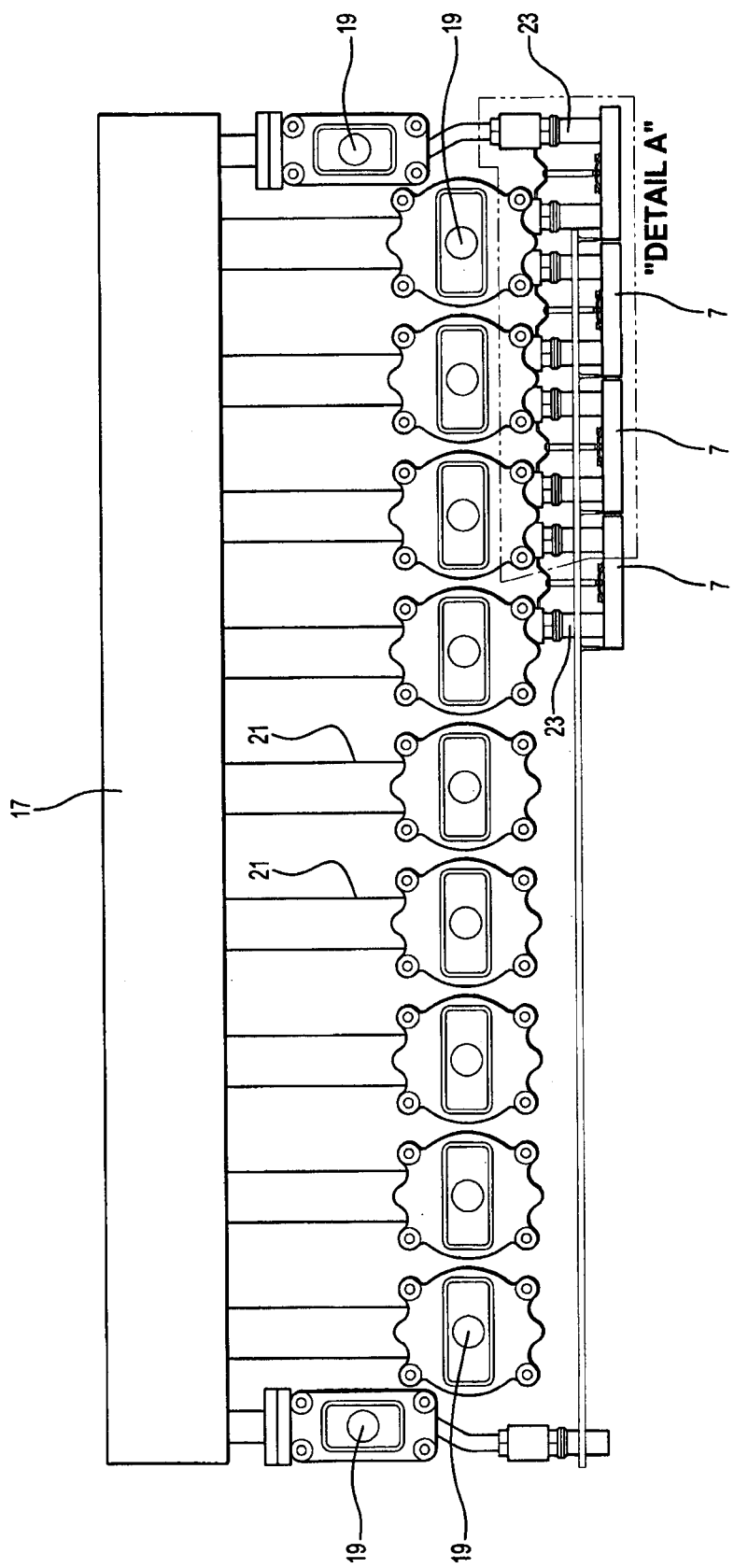
FIG. 3 is an enlargement of one of the two subarrays as shown in FIG. 2.
Figure 4:
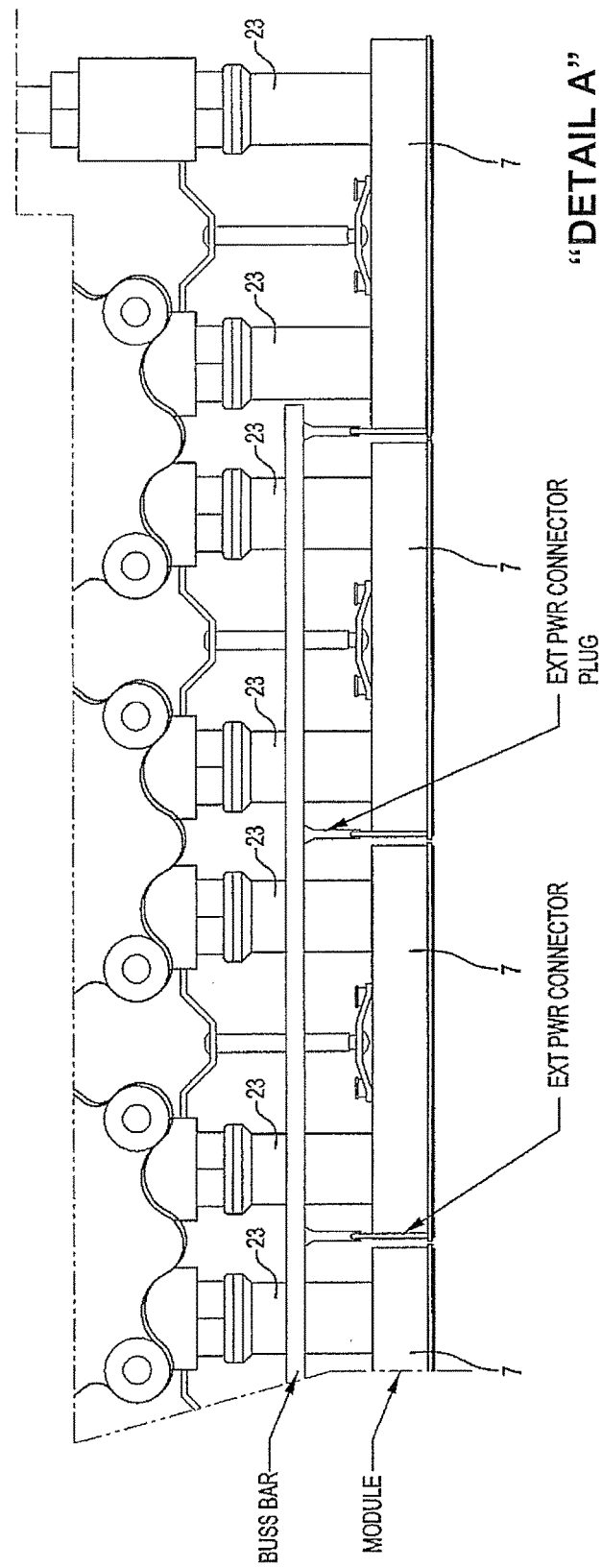
FIG. 4 is detail A in FIG. 3.

The Figures show an embodiment of a receiver 3 in accordance with the present invention that is suitable for use in a solar radiation-based electric power generating system.

By way of example, such a system includes a solar radiation concentrator in the form of an array of mirrors (not shown) or other suitable elements that reflects or otherwise re-directs and focuses solar radiation that is incident on the mirrors towards a solar radiation receiver in the form of a plurality of photovoltaic cells that are arranged in modules. An electrical circuit (not shown) transfers the electrical energy output of the photovoltaic cells to an end-use application for the electrical energy. End-use applications include remote area power supply for isolated grids, mains grid-connected power, water pumping, telecommunications, crude oil pumping, water purification, and hydrogen generation.

The module may be the module that is described and claimed in the International application entitled "Cell Module" in the name of the applicant lodged the same day as the subject International application. The International application claims priority from Australian provisional application 2010904355, and the disclosure in the specifications of the International application and the provisional application are incorporated herein by cross-reference.

With reference to the Figures, the illustrated embodiment of a receiver 3 in accordance with the present invention includes 4 subarrays 5 of modules 7, with each subarray 5 comprising 100 modules 7, and each module 7 comprising 100 photovoltaic cells (not shown).

The photovoltaic cells are closely-packed in each module 7, the modules 7 are closely-packed in each subarray, and the subarrays are closely-packed in the receiver 3.

The present invention is not confined to this number of subarrays. The present invention is not confined to this number of modules in a subarray. The present invention is not confined to this number of photovoltaic cells in each module. The photovoltaic cells may be any suitable size. For example, the photovoltaic cells may be at least 5 mm×5 mm. In a situation where the photovoltaic cells are 10 mm×10 mm, each module 7 is 10 cm×10 cm, and each subarray 5 is 1 m×1 m.

Figure 5:
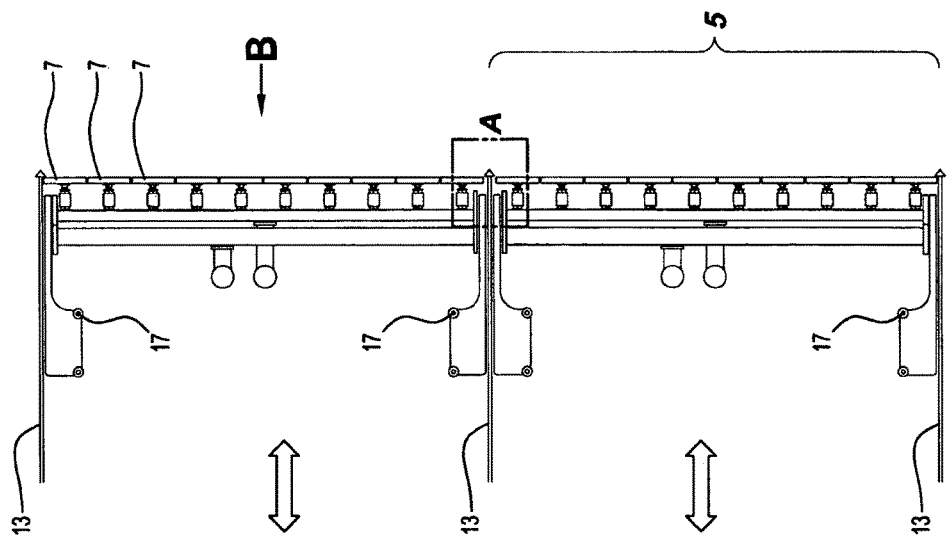
FIG. 5 is a side view of the receiver shown in FIG. 1 in the direction of the arrow "A in FIG. 1.
Figure 7:
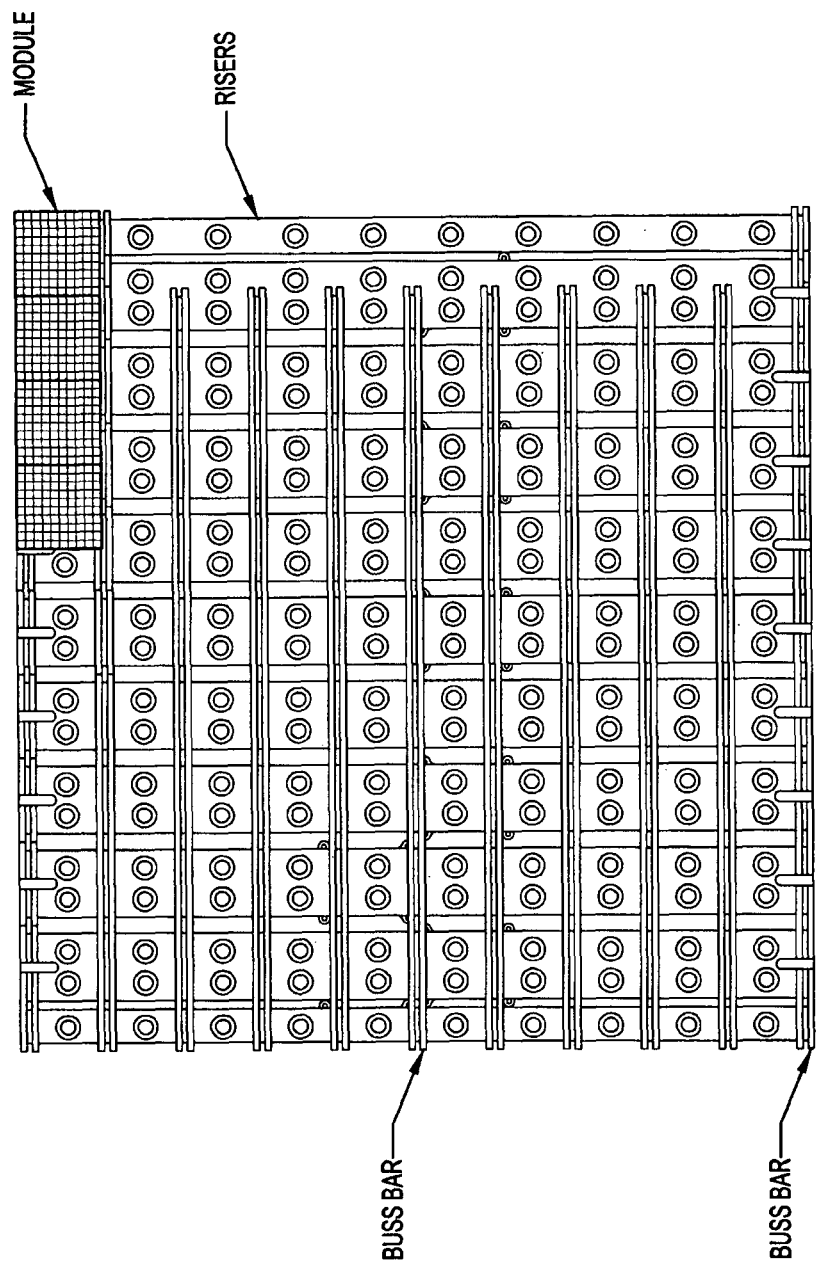
FIG. 7 is a front view of the upper subarray shown in FIG. 5 in the direction of the arrow "B" in FIG. 5 with most of the modules removed from the Figure to show the arrangement of risers and busbars that form part of the subarray.

The receiver 3 also comprises a support frame for supporting the subarrays 5 of modules 7 of photovoltaic cells. The support frame supports the subarrays so that the exposed front surfaces of the photovoltaic cells are substantially in a plane in an operational position of the receiver 3, i.e. a position in which the photovoltaic cells are ready for exposure to solar radiation. In addition, the support frame supports the subarrays 5 so that each subarray can be moved independently of the other subarrays 5 from the operational position shown in the Figures rearwardly, i.e. to the left as shown in FIG. 5, to a maintenance position. The purpose of the movement to the maintenance position is to make it possible for operators to carry out maintenance work on the subarrays 5 and, if necessary, to replace individual components, such as modules 7, of the subarrays 5 or the entire subarrays 5. The linear extent of the movement between the operational position and the maintenance position may be any suitable distance depending on the size of the subarrays 5 and other factors. Typically, the linear distance is at least 0.5 m and more typically 0.6-1.1 m.

The support frame is shown diagrammatically in the Figures as comprising a framework of vertical members 13 and horizontal members 15 and a series of slide elements 17 that directly support the subarrays 5 for sliding movement. The support frame can be described simplistically as a form of cabinet which supports drawers for sliding movement between open and closed positions.

Figure 6:
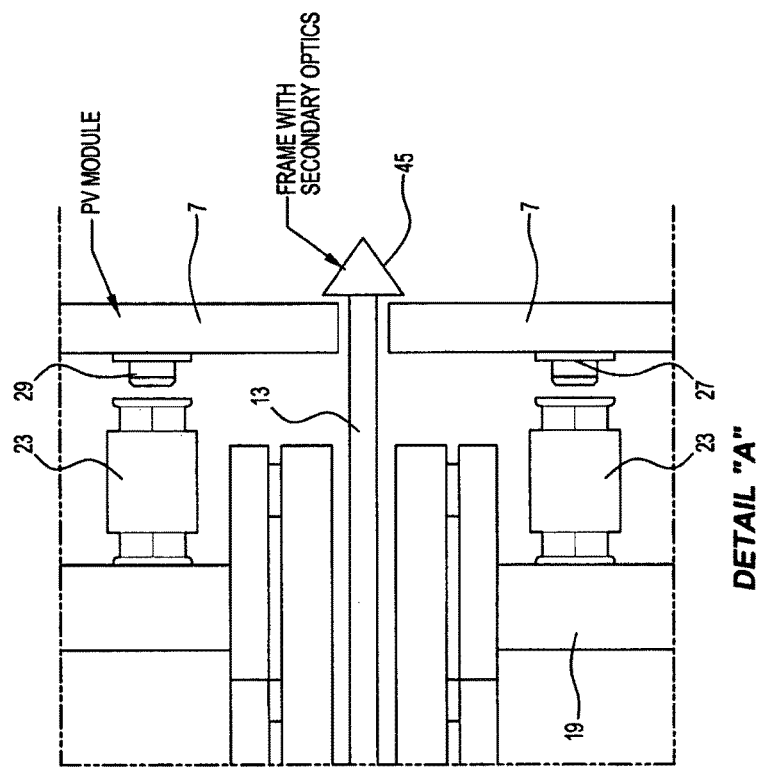
FIG. 6 is detail A in FIG. 5.

The front edges of the support frame members 13, 15 include suitably shaped reflective elements 45 (see FIG. 6) that divert solar radiation that is incident on these edges to the photovoltaic cells The receiver comprises a coolant supply system for supplying coolant (typically water) separately to each subarray 5. The separate supply of coolant to each subarray 5 makes it possible to disconnect one or more subarrays 5 from the receiver coolant system without interfering with the coolant supply to the other subarrays 5.

Each subarray 3 comprises a system for supplying coolant (typically water) from the receiver coolant system to the modules 7 to cool the photovoltaic cells and for removing heated coolant from the modules 7 and supplying the heated coolant to the receiver coolant system. Each subarray coolant system comprises a plurality of supply headers 17 that supply coolant to a series of vertical parallel risers 19 via connection pipes 21. The risers 19 have a series of spigots 23 that are adapted to supply coolant to each module 3, as described below. Similarly, each subarray coolant system comprises a system of spigots 23, risers 19, connection pipes 21, and discharge headers 17 for removing heated coolant from the modules 7. The subarray coolant system supplies coolant to and removes heated coolant from each module 7 separately to the other modules 7 in the subarray. This makes it possible to disconnect one or more modules 7 from a subarray coolant system without interfering with the coolant supply to the other modules 7.

The receiver 3 also comprises an electrical power collection system that collects electrical power separately from each subarray 5.

Each subarray 5 also comprises an electrical power collection system for collecting electrical power from each module in the subarray 7. The subarray electrical power collection system comprises a plurality of pairs of parallel bus bars 31, 33 positioned to connect to positive and negative connections of each of the modules 7.

Each module 7 comprises:

(a) the above-mentioned plurality of photovoltaic cells in a close-packed array;

(b) an electrical connection (not shown) for transferring an electrical energy output of the photovoltaic cells to the subarray electrical power collection system, and (c) an assembly for extracting heat from the photovoltaic cells.

The heat extraction assembly of each module 7 comprises a coolant chamber defined by a base, side walls extending from the base, and the photovoltaic cells connected to the side walls and therefore in heat transfer relationship with the chamber. The heat extraction assembly also comprises a coolant inlet 27 for supplying coolant to the chamber and a coolant outlet 29 for removing heated coolant from the chamber. The inlets 27 and the outlets 29 of the modules 7 and the spigots 23 of the risers 19 are formed as quick release couplings to facilitate convenient engagement and release of the spigots 23 and the inlets 27 and the outlets 29. The quick release couplings may be in any suitable form. For example, the quick release couplings could be of the type used for compressed air couplings and for garden hose couplings. Moreover, the spigots 23 include valves (not shown) that are opened when there is positive coupling engagement of the spigots 23 and the inlets 27 and the outlets 29 and are closed when these couplings are released.

Figure 8:
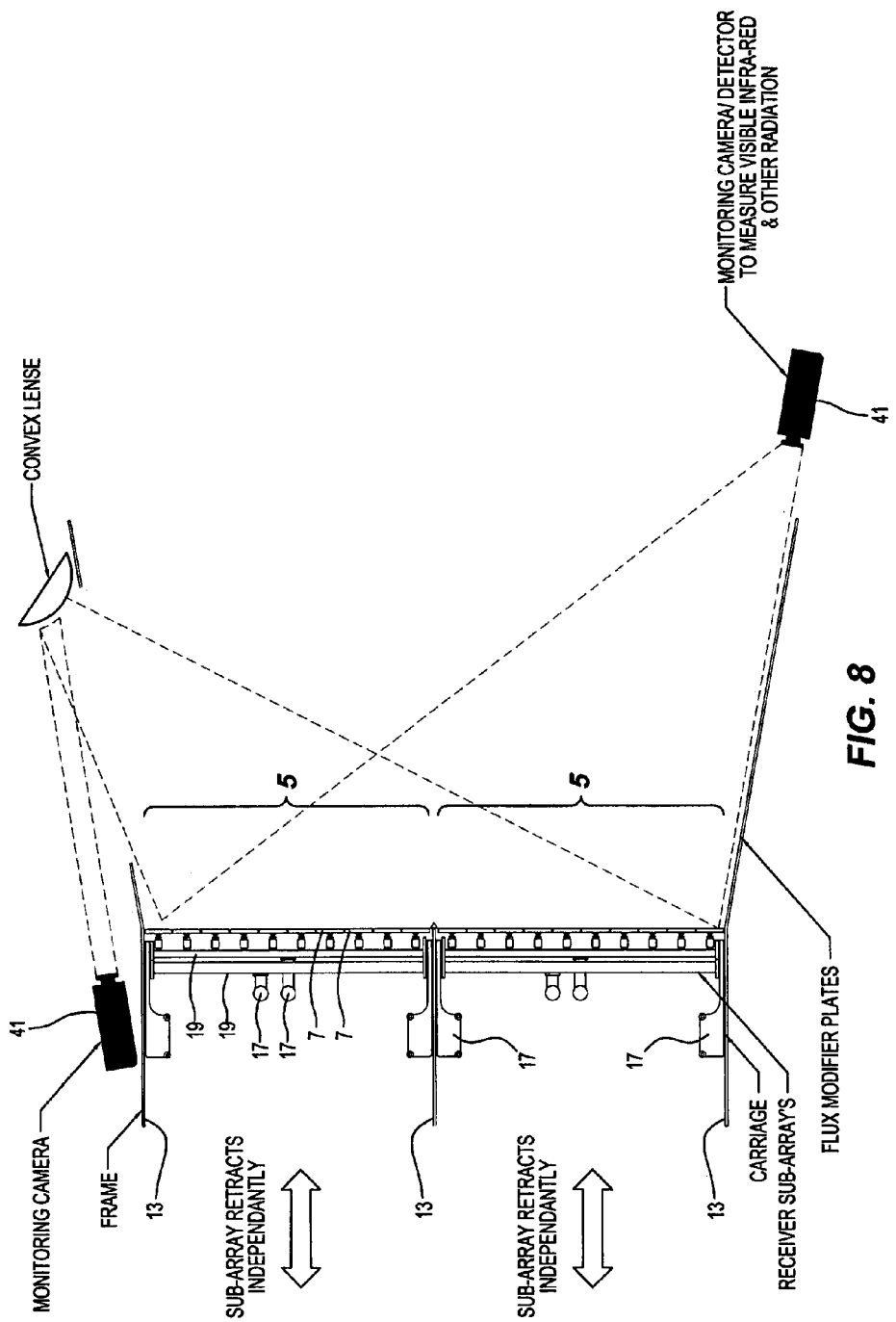
FIG. 8 is a side view similar to that shown in FIG. 5 but which illustrates other components of the receiver.

With reference to FIG. 8, the receiver 3 also includes a management system, such as an optical management system, for avoiding under illumination or excessive illumination of any particular cells in the receiver or otherwise managing the exposure of photovoltaic cells to solar radiation. The system may monitor flux distribution or reflected or emitted spectra of photovoltaic cells any other relevant parameters. The system may include one or more than one camera 41 suitably positioned to inspect the exposed face of the receiver 3. FIG. 8 illustrates two options for camera locations. The information from the cameras 41 can be taken into account to make adjustments to the orientation or other parameters as may be required to produce a required flux distribution.

The information from the cameras 41 can also be taken into account in identifying equipment issues that require maintenance, including possible replacement, as a part of an overall monitoring system for monitoring the condition of any components in the receiver. In this context, the receiver 3 makes it possible to greatly improve the efficiency of operation of solar radiation-based electric power generating system, particularly a large scale system that has a large number of photovoltaic cells. More particularly, the receiver 3 makes it possible to monitor the performance of photovoltaic cells in the receiver 3 during the course of operation or testing of the system and to schedule a program of maintenance work to be carried out when the system is off-Sun and to carry out the work efficiently and safely by successively moving each subarray 5 that requires maintenance work to the maintenance position and carrying out the required work of the subarray 5, thereafter testing and then moving the subarray 5 to the operational position. At the end of the work schedule, a further check of the whole receiver can be made and further maintenance work carried out as required.

Many modifications may be made to the embodiment of the present invention shown in the drawings without departing from the spirit and scope of the invention.

The invention claimed is:

1. A receiver for a solar radiation-based electrical power generation system comprising:
   (a) a plurality of photovoltaic cells, with the cells being arranged in modules, with each module comprising one or more than one cell, with the modules being arranged in subarrays, with each subarray comprising a plurality of modules, and with each subarray being positioned as a separate, independently movable unit;
   (b) a receiver coolant system for supplying coolant to and discharging coolant from each subarray separately to the other subarrays, each subarray comprising a coolant system for supplying coolant from the receiver coolant system to the subarray modules and supplying heated coolant from the subarray modules to the receiver coolant system;
   (c) a receiver electrical power collection system for collecting electrical power from each subarray separately to the other subarrays, and each subarray comprising an electrical power collection system for collecting electrical power separately from each module in the subarray, and
   (d) a support framework for the subarrays, the support framework supporting the subarrays so that each subarray can be separately replaced in the receiver, and the support framework supporting the subarrays so that each subarray can be separately moved from an operational position to a maintenance position displaced rearwardly of the operational position so that maintenance work can be carried out on the subarray and components without removing the subarray altogether from the receiver.

2. The receiver defined in claim 1 comprises a management system, for avoiding shading (i.e. under-illumination) or excessive illumination of any particular cells in the receiver or otherwise managing the exposure of photovoltaic cells to solar radiation.

3. The receiver defined in claim 1 comprises an electrical power collection system for collecting power from the photovoltaic cells.

4. The receiver defined in claim 1 wherein each subarray comprises a close-packed array of modules.

5. The receiver defined in claim 1 comprises a close-packed array of subarrays.

6. The receiver defined in claim 1 wherein the coolant system for each subarray includes separate inlets for supplying coolant to each module in the subarray and separate outlets for removing heated coolant from each module.

7. The receiver defined in claim 1 wherein the receiver coolant system and each subarray coolant system are coupled together, so that it is not necessary to disconnect the subarray coolant system from the receiver coolant system when moving a subarray between the operative position and the maintenance position of the subarray.

8. The receiver defined in claim 1 wherein the support framework comprises a series of rollers or runners or other guide elements that support the subarrays and facilitate rearward and forward sliding or similar movement of each subarray from the operational position to the maintenance position and vice versa.

9. A solar radiation-based electrical power generating system that includes the receiver defined in claim 1.

10. The receiver defined in claim 1 wherein each module comprises a close-packed array of photovoltaic cells.

11. The receiver defined in claim 1 wherein the subarray coolant system for each subarray is a self-sealing system to close the system for an individual module when the module has to be removed from the subarray without affecting the coolant system for other modules.

12. The receiver defined in claim 1 wherein the subarray coolant system for each subarray is a quick release system so that modules can be quickly and conveniently engaged with and released from the coolant system.

13. The receiver defined in claim 1 wherein the subarray electrical power collection system comprises a plurality of busbars arranged so that connection elements of each module in the subarray engage the busbars of that subarray directly.

14. The receiver defined in claim 1 wherein each subarray electrical power collection system is connected electrically via a flexible cable or other suitable means that connects in parallel or series to the receiver electrical power collection system.

15. The receiver defined in claim 11 wherein the self-sealing system comprises one or more self-sealing valves.

* * * * *